United States Patent
Singhal et al.

(10) Patent No.: US 7,137,078 B2
(45) Date of Patent: Nov. 14, 2006

(54) TRACE BASED METHOD FOR DESIGN NAVIGATION

(75) Inventors: Vigyan Singhal, Fremont, CA (US); Joseph E. Higgins, Albany, CA (US); Alok N. Singh, Milipitas, CA (US)

(73) Assignee: Jasper Design Automation, Inc., Mountain Veiw, CA (US)

( * ) Notice: Subject to any disclaimer, the term of this patent is extended or adjusted under 35 U.S.C. 154(b) by 284 days.

(21) Appl. No.: 10/401,315

(22) Filed: Mar. 27, 2003

(65) Prior Publication Data
US 2004/0194046 A1 Sep. 30, 2004

(51) Int. Cl.
*G06F 17/50* (2006.01)

(52) U.S. Cl. .................. 716/1; 716/4; 716/5; 716/6

(58) Field of Classification Search .............. 716/1, 716/4, 5, 6
See application file for complete search history.

(56) References Cited

U.S. PATENT DOCUMENTS

| | | | |
|---|---|---|---|
| 6,240,376 B1 * | 5/2001 | Raynaud et al. | 703/15 |
| 6,397,341 B1 * | 5/2002 | Genevriere | 713/400 |
| 6,530,073 B1 * | 3/2003 | Morgan | 716/18 |
| 6,647,539 B1 * | 11/2003 | Tojima et al. | 716/10 |
| 2002/0183956 A1 * | 12/2002 | Nightingale | 702/120 |

* cited by examiner

Primary Examiner—Sun James Lin
(74) Attorney, Agent, or Firm—Fenwick & West LLP

(57) ABSTRACT

A highlighting system for use with electronic circuit design tools is provided for displaying signal waveforms and Register Transfer Logic (RTL) source code portions corresponding to a selected signal in the same window. The user selects a time and signal to be explored. Based on the selected time and signal, the values of all related signals are identified from a database generated by simulation of RTL source code. Nodes corresponding to the related signals are identified from a gate-level netlist corresponding to the RTL source code and the nodes responsible for the particular value of the selected signal at selected time are identified. The nodes are then mapped on to the RTL source code portions by a process of Instrumentation. The RTL source code portions so identified are then displayed. In particular, the portions of the RTL source code responsible for the particular value or transition in particular value of the signal at the selected time are highlighted.

14 Claims, 12 Drawing Sheets

| | 1 | 2 | 3 | 4 | 5 | 6 | 7 | 8 | 9 | 10 | 11 | 12 | 13 | 14 | 15 | 16 | 17 | 18 | 19 | 20 | 21 |
|---|---|---|---|---|---|---|---|---|---|---|---|---|---|---|---|---|---|---|---|---|---|
| 10 | a | l | w | a | y | s | | @ | ( | p | o | s | e | d | g | e | | c | l | k | ) |
| 11 | | | | | | | | | | | | | y | ⇐ | | a | | | | | |
| 12 | e | n | d | | | | | | | | | | | | | | | | | | | a ; [line = 11; character positions = (16, 16)]

y ; [line = 11; character positions = (14, 14)]

clk ; [line = 10; character positions = (18, 20)]

FIG. 4 assign y = ( a & b ) || ( c & d );

FIG. 5

| a | b | y = a \|\| b |
|---|---|---|
| 1 | - | 1 |
| - | 1 | 1 |
| 0 | 0 | 0 |

FIG. 11 always @ (posedge clk)

if ( ((a & b) \|\| (c & d) )

y <= w & x ;

else  if  (e & f)

y <= w ;

else y <= z;

FIG. 12

```
always @ (posedge clk)
    if ( ((a & b) || (c & d) )
            └─1501
        y <= w & x ;
    else if (e & f)
        y <= w;
    else
        y <= z;
```

FIG. 15

```
                    ┌─1401
always @ (posedge clk)
    if ( ((a & b) || (c & d) )
        y <= w & x ;
                └─1403
    else if (e & f)
        y <= w;
    else
        y <= z;
```

FIG. 14

TRACE BASED METHOD FOR DESIGN NAVIGATION

BACKGROUND

This invention relates to electronic circuit design tools and methodology (expressed as software) that are typically used to capture the design intent and the specific circuit behavior during the design of a circuit. These tools are also used to communicate the design intent and the circuit behavior between a circuit designer and other technical personnel such as design team member. To make the process easier, textual and graphical tools are embedded in these circuit design tools so as to enhance the understanding and visualization of various aspects of the circuit design. These textual and graphical tools provide an interface in order to display waveforms of various signals and in order to highlight various characteristics that are associated with the circuit design. To display waveforms these tools make use of various kinds of timing waveform diagrams, finite state machine transition diagrams, process flowcharts, etc. Indeed, such graphical representations are standard methods that are currently being used in the circuit design industry. Computer Aided Design (CAD) environments combine the design tools with the graphical tools for this purpose. CAD tools typically provide software-automated environments in order to enable communication between a designer and various kinds of computer-related tools, and by doing so, the designer is able to capture, analyze, and manipulate the design data more effectively and efficiently.

As the complexity in circuit design has increased over the last 30 years, there has been a corresponding improvement in various kinds of verification and debugging techniques (for circuit design). In fact, these verification and debugging techniques have evolved from relatively simple transistor circuit-level simulation (in the early 1970s) to logic gate-level simulation (in the late 1980s) to the current art that uses Register Transfer Language (RTL)-level simulation. RTL is a hardware description language (HDL) used in describing the registers of a computer or digital electronic system, and the way in which data is transferred between them.

Contemporary verification and debugging tools use various levels of abstraction for defining design specification. These abstractions are written using high-level description languages. High-level description languages provide a number of functionalities for analyzing and verifying the design while performing simulation. For example, a designer can navigate the design hierarchy, view the RTL source code, and set breakpoints on a statement of the RTL source code to stop the simulation. Also, line numbers are provided in the RTL source code to identify different lines and statements. Further, the verification and debugging tools often support viewing and tracing variables and some times even signal values. These RTL simulation tools typically also offer these and other types of RTL debugging functionalities.

Recent system chip designs exceed a million or more gates. This kind of complexity requires even more abstract design definition (at the RTL-level) than was available in the past, and such a definition may be difficult to manage. Hence, this has led to the development of a behavior-level modeling, which in turn, allows a designer to define system functionality at a higher level of behavior abstraction.

The abovementioned verification and debugging tools (also referred to as RTL Simulators) operate on a digital representation (or a Simulation Model) of a circuit, a list of inputs, and data regarding the performance characteristics of the circuit elements. These tools generate a numerical representation of the circuit response, which can be viewed on a display screen in graphical form.

The verification and debugging tools as mentioned above typically follow a design flow. This design flow comprises creation of a circuit design at the RTL level followed by its verification using the RTL Simulator. This verification results in the generation of a database, which includes the verification results. This database can be then used for providing information regarding the behavior of the designed circuit. Simulation can be performed at greater speeds using gate-level simulators, hardware Accelerators or software simulators called Emulators. Gate-level simulation involves synthesizing the RTL source code into a gate-level "netlist". A netlist is a list of components such as gates, flip-flops, etc. and describes the properties of the components and the connections between them. The gate-level netlist can be then verified using a software gate-level simulator or by converting the gate-level netlist into a format suitable for programming an Emulator, a hardware Accelerator, or a rapid-prototyping system so that the circuit specification can take an actual operating hardware form. Accelerators are hardware elements designed for performing special purpose computation required in circuit simulation. Accelerators perform computation that is much faster than software simulators. However, the ability of Accelerators to debug the design at the gate level is severely limited in comparison with software simulators.

As mentioned above, design flow begins with creation of circuit design at the RTL level. Circuit design is created using the RTL level source code. The RTL source code is specified according to Hardware Description Language (HDL) such as Verilog HDL or VHDL. Circuit designers use high-level hardware description languages because of the size and complexity of modern integrated circuits. Circuit design in high-level language is implemented using computer-implemented software applications. These applications enable a user to dynamically review various design facets. Also, these applications enable a user to utilize text-editing and graphical design tools to create HDL-based design.

In the design flow, creation of the RTL source code is followed by verification so as to check if the RTL source code meets the design specifications. This is done using a "Test Bench" or constraints and requirements. The verification method involving the use of RTL source code and Test Bench is referred to as Simulation process. The Test Bench contains a subset of all possible inputs to the circuit/logic. For an 'n' input circuit, there are $2^n$ possible inputs at any given time. For large n, e.g., for a complex design, the number of possible input sequences becomes prohibitively large. To simplify this, only a subset of all possible inputs is described in any given test bench. The verification method involving RTL source code and constraints is referred to as Model Checking method. Constraints refer to design constraints, i.e. specifications to be satisfied by the circuits. Intensive mathematical properties are used to define circuit specifications in pure mathematical terms. This results in the generation of all possible valid inputs for a given circuit and it is akin to exhaustive simulation, i.e. testing the circuit for all possible inputs.

The simulation process is simple but doesn't verify the circuit behavior for all possible combinations of inputs. Hence, simulation is not very reliable especially for complex design (wherein large combinations of inputs are possible).

The Model Checking method is more exhaustive but utilizes intensive mathematical calculations to verify the circuits.

Results of the verification using the method of either Model Checking or Simulation are stored in a database. This database includes simulation results and design data such as component instances, component pins, routing wire connections, information regarding the buses, etc. The database can be used by a graphical interface to generate timing waveforms for various signals defined in the circuit. The waveforms can also be used to visually highlight various design aspects. This graphical interface is also referred to as the waveform viewer.

Three major categories of tools are currently available in the market to facilitate the RTL-level simulation and testing of circuit designs. These comprise Model Checking tools, Simulation tools and Waveform viewing tools. A typical example of the RTL Simulation tool is ModelSim™ from Model Technology Inc, VCS from Synopsys. A typical example of the Model checking tool is RuleBase from IBM. A typical example of the Waveform viewing tool is Debussy from Novas Software.

Software RTL Simulators provide a high level of verification and debugging environment but have relatively slow speed and verify only a small fraction of the possible input sequences. They provide good flexibility in terms of design verification and also provide a high-level of abstraction environment for verification and debugging. It is easier to change design parameters and observe the changes in the RTL Simulators. However, for complex designs, the verification requires a large number of test vectors. Test vectors comprise a legal input sequence to a given circuit. This can take a considerable amount of time using software RTL Simulation as contrasted with hardware Acceleration or Emulation starting from a gate-level representation. Furthermore, it may be useful to perform in-situ verification. This comprises validating the design under test by connecting the Emulator or hardware Accelerator to the target system environment (where the design is to be inserted after the design is completed). One disadvantage of the gate-level simulation, however, is that most of the high-level information from the RTL source code is lost. Without the high-level information, many of the debugging functionalities are unavailable.

Currently, effort has been directed towards improving the visualization of the circuits and the various parameters guiding the circuit design. This involves display of various waveforms and expressions corresponding to the characteristic waveform of the signal. The existing waveform viewers such as Debussy and Signalscan have the ability to display the waveform of the signals and also display corresponding expressions in separate windows. Further, these waveform viewers provide an added functionality of adding or dropping an icon representing a collection of signals on the waveform-displaying window. Additionally, it is also possible to display a portion of the source code corresponding to a waveform by clicking on the waveform and vice-versa.

The existing waveform viewers display portions of source code and waveforms in different windows. However, there is a need for a system and method that displays the portions of the RTL source code and the waveform in the same window. This is required to enhance the readability and visualization of the circuit parameters. Further, there is a need for a system and method that provides the reason for a characteristic waveform to a designer. This facility will help the designer to better understand the circuit design (as embodied in the RTL source code) and behavior. Also, there is a need for a system and method that isolates and displays only the portion of the RTL source code (and possibly some surrounding source code to provide context) that correspond to a waveform that the designer desires to see. Also, there is a need to have a means of interactively browsing the RTL source code and debugging problems in the RTL source code in the context of a simulation value database.

SUMMARY

The present invention is directed to a system, method and computer program for presenting signal waveforms to a user along with source code corresponding to the presented signal.

An object of the present invention is to provide a system, method and computer program that display portions of the RTL source code and the waveform in the same window.

Another object of the present invention is to provide a system, method and computer program that identify and present only those portions of the RTL source code that correspond to the displayed waveform.

Another object of the present invention is to provide a system, method and computer program that highlight those portions of the RTL source code from the displayed portion that are responsible for the value of the selected signal or transition in the value of the selected signal at the selected time.

Yet another object of the present invention is to provide a system, method and computer program that select a portion of the previously highlighted RTL source code to refine the analysis to present portions of the RTL source code that are responsible for value of the previously highlighted RTL source code.

Another objective of the present invention is to provide a system, method and computer program that works interactively with the user to attain abovementioned objectives.

To attain the above-mentioned objectives, the first step is to describe the circuit specification using RTL source code. To describe the circuit, RTL source code is written in a hardware description language such as Verilog, VHDL, etc. The RTL source code is processed to generate a Simulation Value Database. To generate the Simulation Value Database, a Model Checking tool based on circuit constraints or a Simulator based on Test Bench is used. The Simulation Value Database includes values of signals defined in the circuit specification at different times.

Further, a gate-level netlist corresponding to the RTL source code is generated. After generation, instrumentation information is added to create an Instrumented Gate-level Netlist. Instrumentation is performed on the RTL source code by an Instrumentation Engine. In this process, the RTL source code is annotated with line numbers and character numbers. To instrument the gate-level netlist, nodes in the netlist are annotated. To annotate the nodes, the Instrumentation Engine identifies location information (line numbers and character numbers) for all leaf nodes and intermediate nodes. To identify the location information, the Instrumentation Engine scans the RTL source code token by token. A token refers to either a word or a character depending on the HDL language specification. Location information for leaf nodes is identified directly by scanning. To calculate the location information of intermediate nodes, the Instrumentation Engine works with a Synthesis Engine. The Synthesis Engine provides a data structure view of the gate level netlist. Using data structure, the Instrumentation Engine calculates location information for the intermediate nodes. In this manner, the Instrumentation Engine obtains location information of the leaf nodes and intermediate nodes. The process of instrumentation generates instrumentation data, which represents mapping between the RTL source code and the gate-level netlist. That is, instrumentation data is used to map each of the nodes and sub-nodes of the gate-level netlist to the corresponding portion of the RTL source code.

Location information generated by the Instrumentation Engine is used to highlight signals corresponding to the user's query. The process of highlighting is performed using a Highlighting Analysis Engine. The Highlighting Analysis Engine identifies the portions of the RTL source code to be highlighted based on the instrumentation data created by the Instrumentation Engine and the Simulation Value Database.

The process of isolation and highlighting of the RTL source code is initiated when a user selects a time and signal to be explored. For this selection of time and signal, the user is provided with a GUI (Graphical User Interface) Display. The data to be presented on the GUI display is managed by a GUI Display Engine. The GUI Display presents different signal waveforms and the corresponding RTL source code in one window. In a GUI display window, signals are displayed in a Plot Window and portions of the RTL source code are presented in a window subsequently referred to as 'Why' Window. In addition to the Plot Window and the 'Why' Window, the GUI Display window comprises a Signal Window that lists out all signals defined in the RTL source code. Within the GUI Display window, the user is provided with an option to click one of the signals at a desired time instance. The GUI Display Engine sends the user's request to the Highlighting Analysis Engine. Based on the selected time and signal, the values of all relevant signals are identified from the Simulation Value Database, and the nodes corresponding to the related signals are identified from the netlist. Further, sub-nodes responsible for the particular value of the selected signal at a selected time are identified. To identify the sub-nodes, input and output values corresponding to the identified node are obtained from the Simulation Value Database. The Highlighting Analysis Engine traverses the netlist backwards to identify the reason for the particular value of the selected signal at selected time. The instrumentation data is then used to identify the RTL source code portion corresponding to the identified nodes and sub-nodes. The RTL source code portion so identified is then displayed using the GUI Display. In particular, the portion of the RTL source code responsible for the particular value of the signal at the selected time is highlighted.

BRIEF DESCRIPTION OF THE DRAWINGS

The preferred embodiments of the invention will hereinafter be described in conjunction with the appended drawings provided to illustrate and not to limit the invention, wherein like designations denote like elements, and in which:

FIG. 4 shows instrumentation data corresponding to the RTL source code and the gate level netlist shown respectively in FIG. 2 and FIG. 3.

FIG. 5 shows an example of RTL source code.

FIG. 11 shows a truth table for an 'OR' expression.

FIG. 12 shows an example of RTL source code.

FIG. 14 shows the output of user's query related to signal 'y' as defined in RTL source code of FIG. 12 and circuit of FIG. 13.

FIG. 15 shows the output when the user clicks on a highlighted portion of FIG. 14.

DESCRIPTION OF PREFERRED EMBODIMENTS

Figure 1:
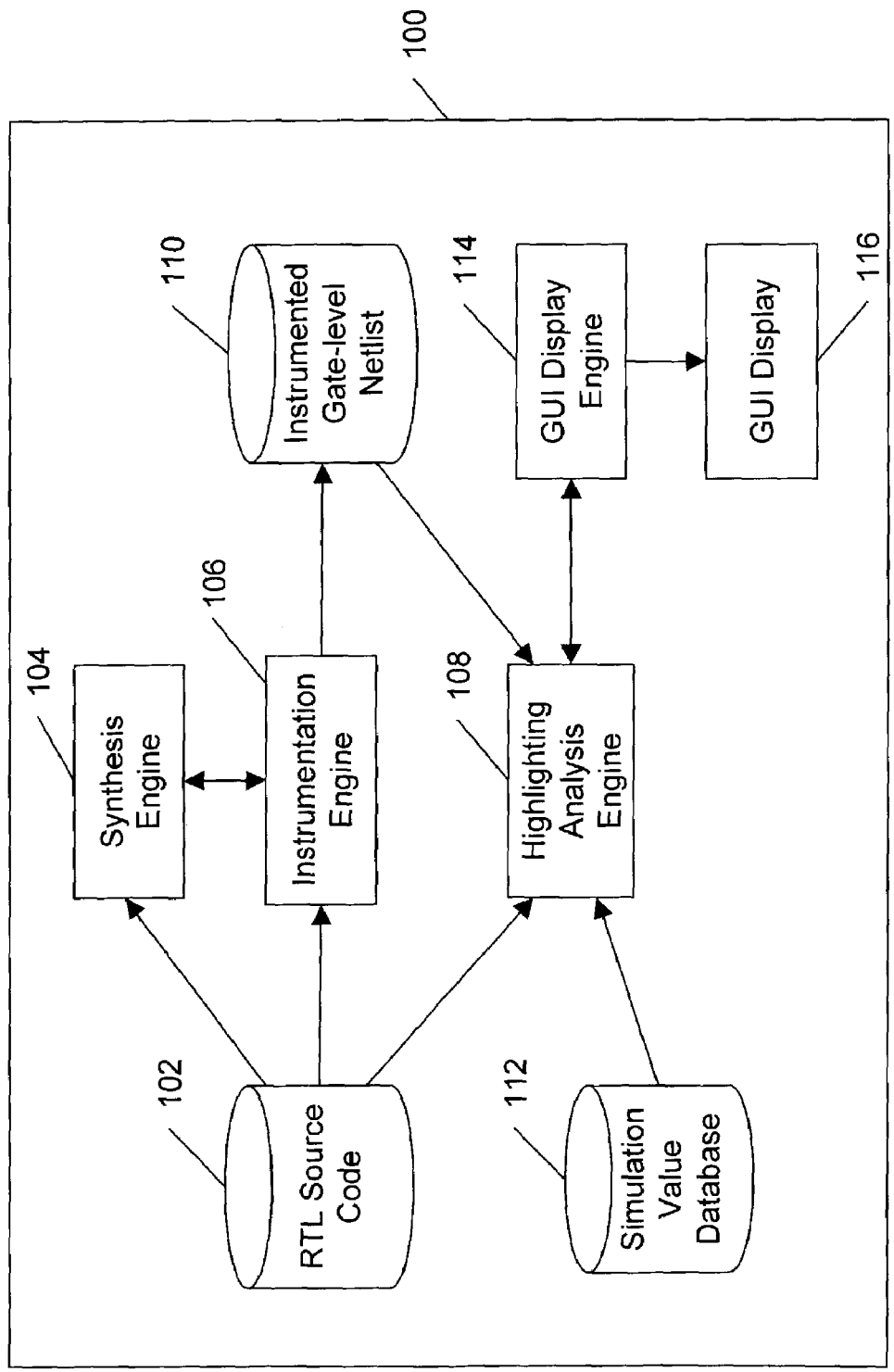
FIG. 1 is a schematic representation of a highlighting system in accordance with a preferred embodiment of the invention.

FIG. 1 shows a block schematic of a highlighting System 100 in accordance with a preferred embodiment of the invention. The setup shows an RTL source code 102, a Synthesis Engine 104, an Instrumentation Engine 106, a Highlighting Analysis Engine 108, an Instrumented Gate-level Netlist 110, a Simulation Value Database 112, a GUI Display Engine 114 and a GUI Display 116. RTL Source Code 102 describes circuit specification in a high level language. RTL Source Code 102 is simulated (using an RTL-simulator) to generate Simulation Value Database 112. Simulation Value Database 112 includes values of signals defined in the circuit specification for a consecutive range of time step. Simulation Value Database 112 associates a value to each signal at each time step. The values associated are typically '0', '1' and 'X' representing false, true and don't care or indeterminate values respectively. RTL Source Code 102 is also synthesized to generate a logic network using Synthesis Engine 104. Synthesis Engine 104 is used for converting the high-level specification of the circuit into gate-level netlist. After generating the gate-level netlist, instrumentation is performed on the netlist. This comprises generation of instrumentation data using Instrumentation Engine 106. Instrumentation data along with the gate-level netlist comprise the logic network referred to as Instrumented Gate-level Netlist 110. Simulation Value Database 112 and Instrumented Gate-level Netlist 110 are applied to Highlighting Analysis Engine 108. Highlighting Analysis Engine 108 is used to isolate and highlight relevant portions of RTL Source Code 102 corresponding to a signal selected by a user. The isolated and highlighted portions are then displayed on GUI Display 116 using GUI Display Engine 114.

RTL Source Code 102 is written in a hardware description language such as Verilog, VHDL etc. RTL Source Code 102 describes the specification of the circuit in terms of signals and conditions under which the signals are generated. RTL Source Code 102 is verified using an RTL Simulator. For this purpose, a Model Checking tool based on circuit constraints or a Simulator based on Test Bench is used. The simulation process results in generation of Simulation Value Database 112. Simulation Value Database 112 comprises results of simulation as well as design data such as component instances, component pins, routing wire connections, etc. Simulation Value Database 112 is used to generate a timing waveform of a selected signal using GUI Display Engine 114. Further, Simulation Value Database 112 is used to highlight a portion of RTL Source Code 102 that contains the description of the signal. The process of highlighting includes isolating that portion of RTL Source Code 102, which defines the selected signal. Within the isolated portion of RTL Source Code 102, the portions responsible for a particular value or transition in value of the signal at the selected time are highlighted. The option of highlighting the portions responsible for a particular value or transition allows the user to browse RTL Source Code 102 interactively. Further, the user can use highlighting to debug the RTL Source Code 102 if there is an error. For instance, if the value of a signal defined in RTL Source Code 102 is not as desired by the user, he/she could interactively browse through RTL Source Code 102 to identify the error.

Figures 2, 3:
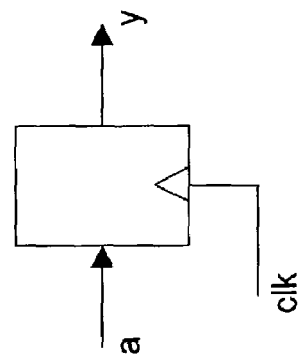
FIG. 2 shows an example of RTL source code annotated with line numbers and character numbers.
FIG. 3 shows a gate level netlist corresponding to the RTL source code shown in FIG. 2.

The process involving isolating and highlighting requires Simulation Value Database 112 as well as Instrumented Gate-level Netlist 110 generated by Instrumentation Engine 106. Synthesizing RTL Source Code 102 generates gate-level netlist. The gate-level netlist, in a preferred embodiment, comprises nodes and edges. Nodes represent signals defined explicitly (or implicitly as signals representing the values of sub-expressions) in RTL Source Code 102. Edges describe the conditions under which the signals are generated. The gate-level netlist is instrumented by the process of Instrumentation. Instrumentation is a process of preserving high-level information through the Synthesis process. Instrumentation results in generation of instrumentation data. Instrumentation data represents mapping between RTL Source Code 102 and the gate-level netlist. In a preferred embodiment, instrumentation data indicates line numbers and character numbers of RTL Source Code 102. A line number refers to a line in RTL Source Code 102, while a character number refers to position of a character in a line. The method of instrumentation can be further explained using example provided in FIG. 2. RTL source code shown in FIG. 2 is instrumented with line numbers and character numbers. Corresponding to the RTL source code shown in FIG. 2, which represents a flip-flop, Synthesis Engine 104 generates a netlist shown in FIG. 3. The nodes in the netlist are annotated to identify the nodes. The nodes shown in FIG. 3 are annotated with 'a', 'y' and 'clk'. Node 'a' corresponds to signal 'a' of RTL source code, node 'y' corresponds to signal 'y' and node 'clk' corresponds to signal 'clk' of the RTL source code. Instrumentation data corresponding to the RTL source code and the netlist shown respectively in FIG. 2 and FIG. 3 is shown in FIG. 4.

The gate-level netlist is instrumented by generating location information using Instrumentation Engine 106. The location information of a node comprises determination of starting and end point of the signal corresponding to the node. Instrumentation Engine 106 views RTL source code to be instrumented as a sequence of tokens. Instrumentation Engine 106 scans the RTL source code token by token. For example, RTL source code shown in FIG. 2 is scanned in order as shown below:

Always→@→(→posegde→clk→)→begin→y→
→a→;→end.
⇐

Figure 6:
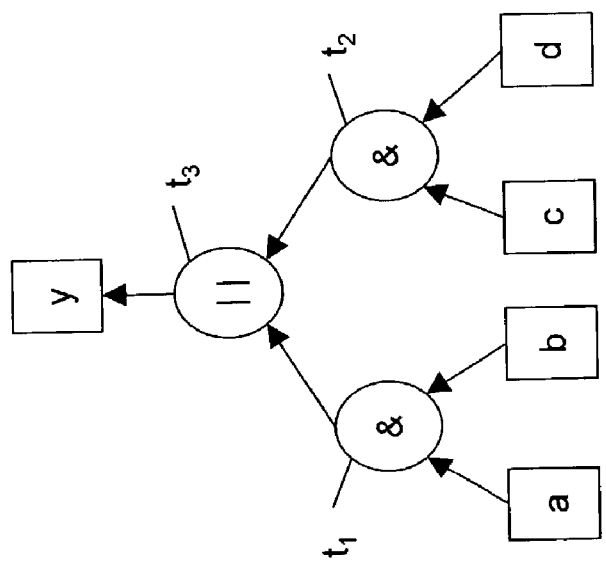
FIG. 6 shows a complex view of an expression defined using the RTL source code of FIG. 5 as provided by the Synthesis Engine.
Figure 7:
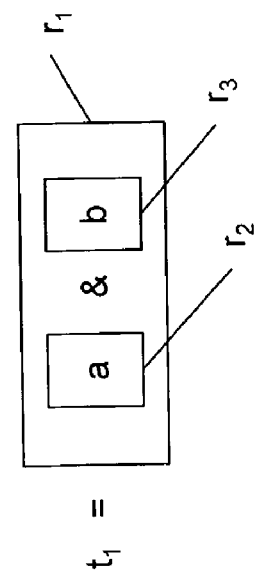
FIG. 7 shows intermediate node $t_1$ as seen by the Instrumentation Engine for calculating location information.

After scanning, Instrumentation Engine 106 assigns location information to each token. For assigning location information to each token in RTL source code, Instrumentation Engine 106 works with Synthesis Engine 104. For example, for the RTL source code shown in FIG. 5, the location of every leaf variable, i.e., 'y', 'a', 'b', 'c' and 'd', can be calculated by Instrumentation Engine 106 by scanning. However, Synthesis Engine 106 provides a complex view of the expression as shown in FIG. 6. In FIG. 6, variables shown within rectangles are leaf variables of the expression, like 'y', 'a', 'b', 'c' and 'd'. Variables shown within circles are intermediate nodes of the expression, like $t_1$, $t_2$ and $t_3$. Instrumentation Engine 106 calculates the location information of the leaf variables by scanning. Instrumentation Engine 106 calculates the location information of intermediate nodes by calculating the smallest rectangle that contains the leaf variables. For example, for calculating the location information of intermediate variable $t_1$=(a & b), the RTL source code is viewed as shown in FIG. 7. Location information for rectangles $r_2$ and $r_3$ is calculated by scanning. Location information for rectangle $r_1$ can be calculated using the location information of rectangles $r_2$ and $r_3$ as follows:

$$r_1.\min=\min(r_2.\min, r_3.\min);$$

$$r_1.\max=\max(r_2.\max, r_3.\max);$$

The term '$r_1$.min' refers to the starting point in the RTL source code of the node corresponding to this rectangle and '$r_1$.max' refers to the ending point in the RTL source code of the node corresponding to this rectangle. Similarly, '$r_2$.min' and '$r_2$.max' refer to starting and ending points corresponding to rectangle $r_2$ and '$r_3$.min' and '$r_3$.max' refer to starting and ending points corresponding to rectangle $r_3$. Thus, Instrumentation Engine 106 calculates the location information for every node using Synthesis Engine 104. The location information for leaf nodes and intermediate nodes is stored in database in a manner shown in FIG. 4.

Figure 8:
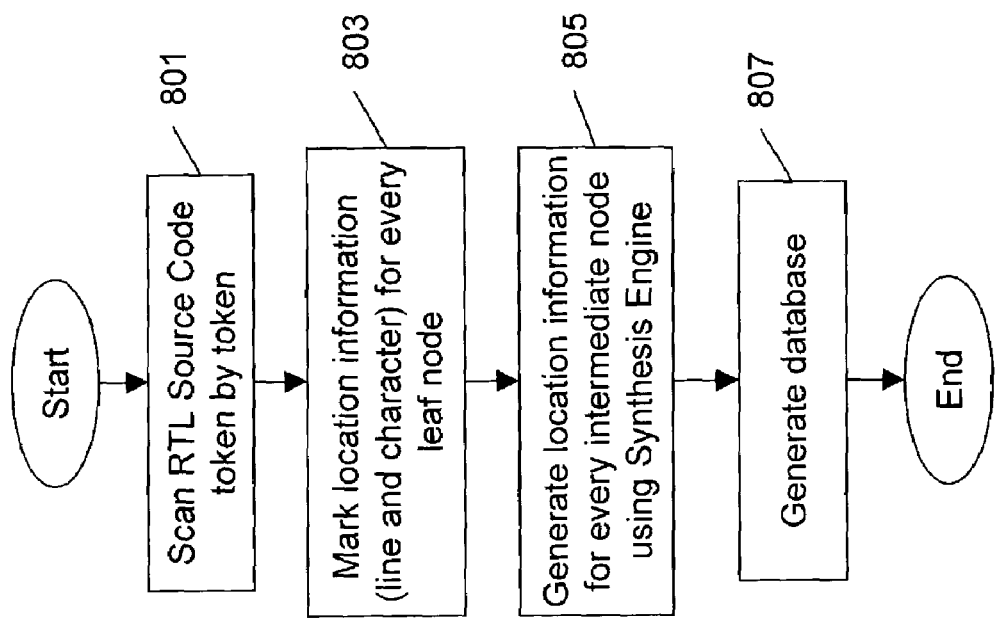
FIG. 8 is a flowchart depicting various steps followed by the Instrumentation Engine to calculate location information for leaf nodes and intermediate nodes.

To summarize, Instrumentation Engine 106 follows the procedure shown using the flowchart (shown in FIG. 8) to calculate the location information for leaf nodes and intermediate nodes. At step 801, Instrumentation Engine 106 scans RTL Source Code 102 token by token. At step 803, Instrumentation Engine 106 identifies the location (line and character numbers) of every leaf node of the RTL Source Code 102. A leaf node may be defined as node in the circuit design that has no children nodes. At step 805, the location information of every intermediate node is identified. Instrumentation Engine 106 performs this step using Synthesis Engine 104. In this manner location information of the leaf nodes and intermediate nodes is obtained by Instrumentation Engine 106. At step 807, the location information thus generated is stored in a database in the manner shown in FIG. 2.

Location information generated by Instrumentation Engine 106 is used to highlight portions of RTL source code corresponding to the user's query. The process of highlighting is performed using Highlighting Analysis Engine 108. Highlighting Analysis Engine 108 makes use of the location information created by Instrumentation Engine 106. Highlighting Analysis Engine 108 finds out the portions of RTL source code to be highlighted based on the instrumentation data created by Instrumentation Engine 106 and Simulation Value Database 112.

It is possible that some nodes in the gate level netlist do not have location information associated with them. For example, intermediate node $t_1$ (which is a 'MUX' gate) in FIG. 13 has no location information as it is the result of the synthesis process and there is no object in the RTL source code of FIG. 12 that directly corresponds to $t_1$. If a node has no associated location information, it can be highlighted by obtaining (possibly in a recursive manner) the location information of the fan-in of the node, possibly taking into account the type of the node and values of signals obtained from the Simulation Value Database 112. To illustrate, consider node $t_1$ of FIG. 13. In order to highlight node $t_1$, the type of the node is first considered. Since node $t_1$ is a 'MUX' gate with no associated location information, the value of conditional node $t_2$ is examined. Since the value of node $t_2$ is '1', '1 input node' of the 'MUX' gate, node $t_4$ (which has associated highlight information), is highlighted. Node $t_4$ is highlighted since it completely determines the value of node $t_1$ when the value of node $t_2$ is '1'.

Figure 9:
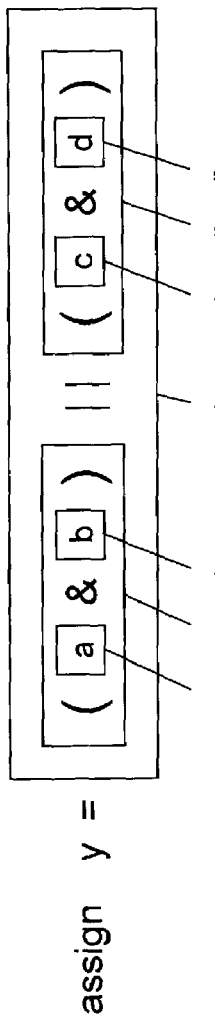
FIG. 9 shows the RTL source code (previously shown in FIG. 5).
Figure 10:
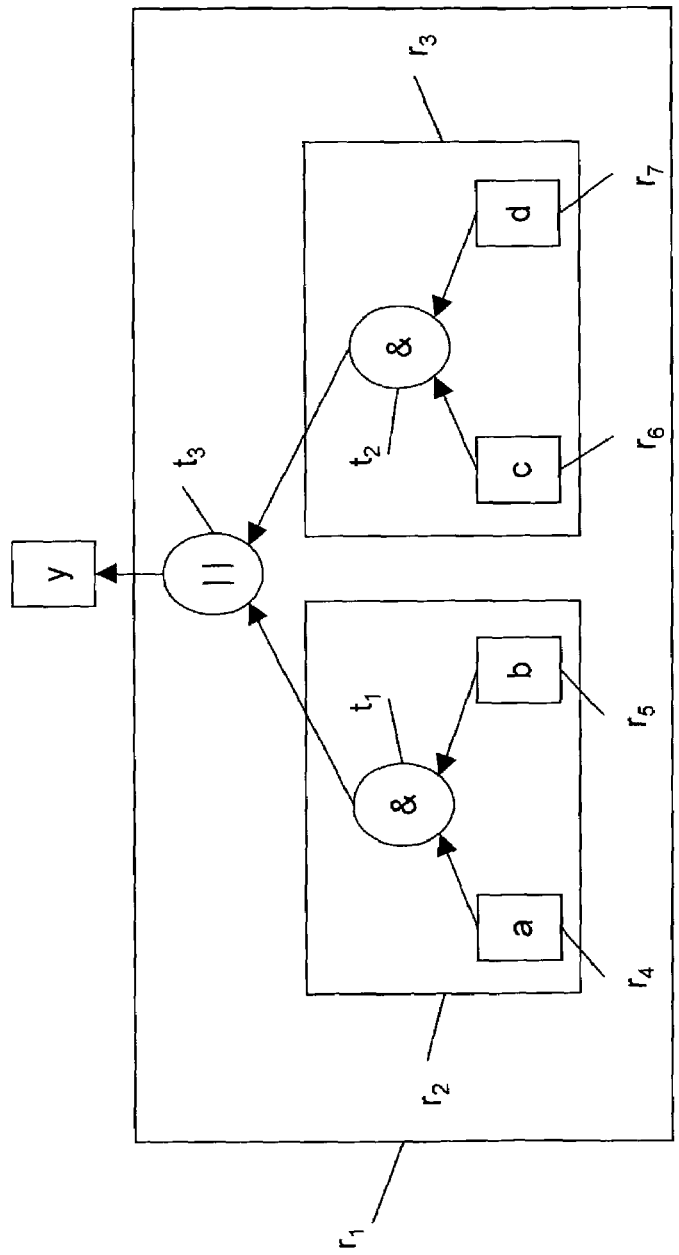
FIG. 10 shows a data structure view corresponding to the RTL source code shown in FIG. 9.

To further elaborate, if the value of node $t_2$ was '0' instead, '0' input node of the 'MUX' gate, node $t_3$ would have been highlighted. Node $t_3$ would have been highlighted as the value of node $t_3$ completely determines the value of node $t_1$ when the value of node $t_2$ is '0'. If the value of node $t_2$ were 'X' instead, then both nodes $t_3$ and $t_4$ would be highlighted since it is not possible to determine which value determined the value of node $t_1$ in this case. Consider the RTL source code shown in FIG. 9 (previously shown in FIG. 5). Data structure view corresponding to the RTL source code is shown in FIG. 10. There is one to one correspondence between the RTL source code and the data structure. For example, rectangles $r_1$, $r_2$, $r_3$, $r_4$, $r_5$, $r_6$ and $r_7$ of the RTL source code are shown in the data structure. Consider a case where a user wants to know why signal 'y' has a particular value at a specified time, when the signals have the values y='1', a='1', b='1', c='1' and d='0'. To make such a request, the user clicks on signal 'y' on GUI Display 116. The user's request is forwarded to Highlighting Analysis Engine 108. Highlighting Analysis Engine 108 highlights the expression(s) that generate given value or transition in value of the requested signal, as per flowchart of FIG. 16. Thus, in this case, rectangle $r_1$ (which corresponds to (a & b)||(c & d)) is highlighted. To identify and highlight the expression within rectangle $r_1$, Highlighting Analysis Engine 108 makes use of the location information of intermediate node $t_3$.

The user may again click on the highlighted portion to determine the reason of the value of the highlighted portion. If the user clicks on rectangle $r_1$, sub-expression(s) within rectangle $r_1$ are highlighted that generate the given value of rectangle $r_1$. Highlighting Analysis Engine 108 identifies that rectangle $r_1$ corresponds to node $t_3$ which is an 'OR' gate. The input nodes of node $t_3$ are nodes $t_1$ and $t_2$ that correspond to rectangles $r_2$ and $r_3$ respectively. Truth table for an 'OR' gate is shown in FIG. 11. Highlighting Analysis Engine 108 consults Simulation Value Database 112 to find out the values of nodes $t_1$ and $t_2$. On finding that the value of node $t_1$ is '1', Highlighting Analysis Engine 108 does not need to care about the value of node $t_2$ (in accordance with truth table shown in FIG. 11). Thus, Simulation Value Database 112 further examines node $t_1$ only. At this point Highlighting Analysis Engine 108 highlights the corresponding rectangle $r_2$. Thus, output is displayed as:

| a & b | || c & d

It should be noted that for certain signal value assignments (e.g., consider a modification of the previous example in which the signals have the values y=1, a=1, b=1, c=1 and d=1), Highlighting Analysis Engine 108 can choose to highlight either the expression 'a & b' or the expression 'c & d'. In this embodiment, the leftmost valid possibility is consistently chosen, but it will be clear to those skilled in the art that other valid highlight policies exist. As an alternate embodiment, a simpler highlighting policy is to highlight all valid possibilities. As another alternate embodiment, another straightforward highlighting policy is to choose the rightmost possibility when more than one valid possibility exists. As another alternate embodiment, the highlighting policy is to examine all valid possibilities and highlight the possibility corresponding to the least amount of text to be highlighted. As yet another alternate embodiment, the highlighting policy is to highlight the possibility corresponding to the expression with the minimum number of operators. The particular choices made for highlighting will be subsequently referred to as the highlight policy.

The purpose of using a highlight policy, such as previously described, is to present the user with the minimal information necessary to understand why the selected signal has the particular value at the selected time. In the preceding example, the highlighted output allowed the user to focus on the values of the signals 'a' and 'b', since these values alone determine the value of the expression. If the user wished to understand why the expression 'a & b' had the particular value (1 in this example), he/she could click on the highlighted rectangle containing 'a & b' and ask System 100 to explain the reason for the value. In the context of the current example, System 100 would respond by highlighting the signals 'a' and 'b', since both are necessary to determine the current value.

The preceding discussion illustrates how portions of the RTL source code are highlighted in the context of Simulation Value Database 112 when the nodes selected correspond to an 'OR' or a 'MUX' gate. It will be clear to those skilled in the art that similar techniques can be applied to other gates (e.g., 'AND', 'XOR', 'INVERT', 'EQUALS', etc.).

In this manner, Highlighting Analysis Engine 108 traverses backwards step by step to find reason for a particular value or transition in value of a signal chosen by the user. While traversing backwards, Highlighting Analysis Engine 108 determines if the selected signal belongs to a combinatorial or sequential circuit. In case the selected signal belongs to a combinatorial circuit, nodes and sub-nodes are identified considering the same time step as selected by the user. On the other hand, in case the selected signal belongs to a sequential circuit, nodes and sub-nodes are identified considering time step prior to the time step selected by the user. That is, in case the user selects a signal at time step 't', nodes and sub-nodes are identified considering time 't−1'.

Figure 13:
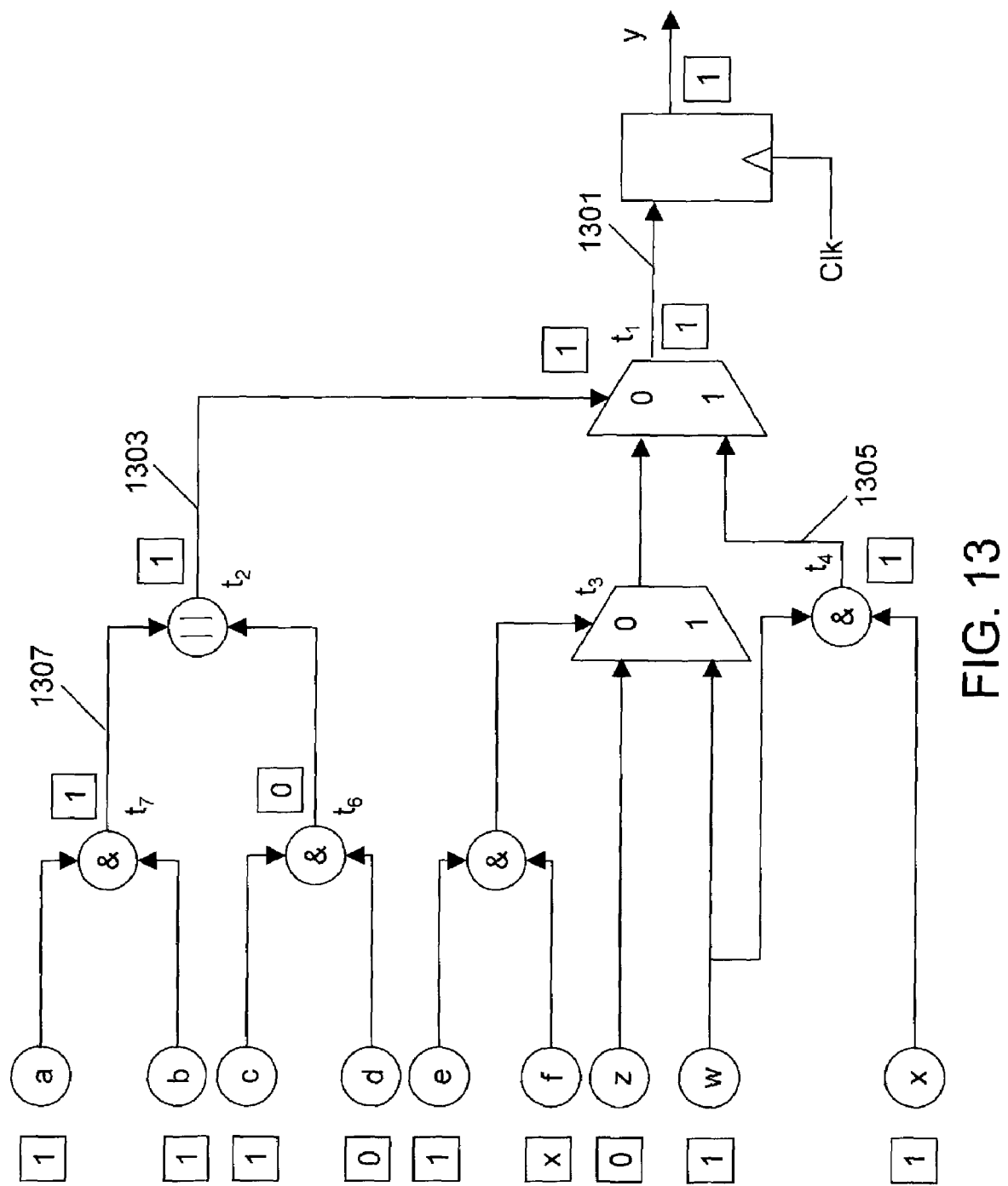
FIG. 13 shows a representation of the gate level netlist and the intermediate nodes corresponding to the RTL source code provided in FIG. 12.

Consider another example of the RTL source code shown in FIG. 12. The gate level netlist corresponding to the RTL source code is shown in FIG. 13. Highlighting Analysis Engine 108 traverses backwards to determine the reason signal 'y' has the particular value. The value of signal 'y' is determined from Simulation Value Database 112. At the first step of traversing backwards, Highlighting Analysis Engine 108 identifies that 'y' is output of a flip-flop. Thus, the value of signal at node $t_1$ needs to be '1' in the previous clock cycle when signal y is '1' in the present clock cycle.

The intended usage of System 100 described is incremental and interactive. To illustrate consider the following sequence of two actions by the user and the relationship to FIGS. 13–15. All actions are taken in context of the simulation values provided in FIG. 13.

1) On a plot window at the relevant time step, the user selects the 'y' signal and asks System 100 why signal 'y' has value '1' at the relevant time. System 100 traverses signal 'y' in the gate level netlist in FIG. 13. Since 'y' is a sequential element, the simulation values, corresponding to the previous time step, are used in the subsequent traversals. The traversal encounters node $t_1$. System 100 traverses the path shown by arrow 1301 in backward direction to reach node $t_1$. Node $t_1$ has no associated location information (as discussed earlier). Therefore, System 100 highlights relevant nodes in the fan-in of the 'MUX' node $t_1$. In this example, since the simulation value of node $t_2$ evaluates to '1', node $t_4$ is highlighted. System 100 traverses path shown by arrow 1303 in backward direction to reach node $t_2$ and path shown by arrow 1305 in backward direction to reach node $t_4$. Thus, System 100 highlights the locations corresponding to nodes $t_2$ and $t_4$, (shown as rectangles 1401 and 1403 respectively in FIG. 14). FIG. 14 shows the output of the analysis to be shown to the user using GUI Display 116.

2) On the RTL source code display portion of the window, the user selects rectangle 1401 in FIG. 14 and asks System 100 why the conditional expression '(a & b)||(c & d)' has the particular simulation value '1'. System 100 determines that the corresponding node is $t_2$ and traverses back from this node. (Since node $t_2$ is an 'OR' gate, a combinational element, the time step is not changed.) The fan-in of node $t_2$ consists of nodes $t_6$ and $t_7$, both of which have location information. Since the simulation value of nodes $t_6$ and $t_7$ are '0' and '1' respectively, node $t_6$ does not contribute to node $t_2$ having the value '1'. System 100 traverses the path shown by arrow 1307 in backward direction. Thus, System 100 highlights the location corresponding to the nodes $t_7$, which is a rectangle 1501 as shown in FIG. 15. The highlighted expression is shown inside rectangle 1501. The user can click on rectangle 1501 to further narrow down the query. Smaller rectangles are displayed on such queries. The user is provided with option of clicking a rectangle unless the signal highlighted in the rectangle corresponds to a leaf node.

The portion of the RTL source code displayed on GUI Display 116 changes in response to two events:

The user selects a signal at a particular time and asks System 100 to display portion of the RTL source code responsible for the value of the selected signal at the selected time.

The user selects an initial highlighted rectangle and asks System 100 to display a new set of highlighted rectangles in the RTL source code window that are responsible for the value of the initial highlighted rectangle.

Figure 16:
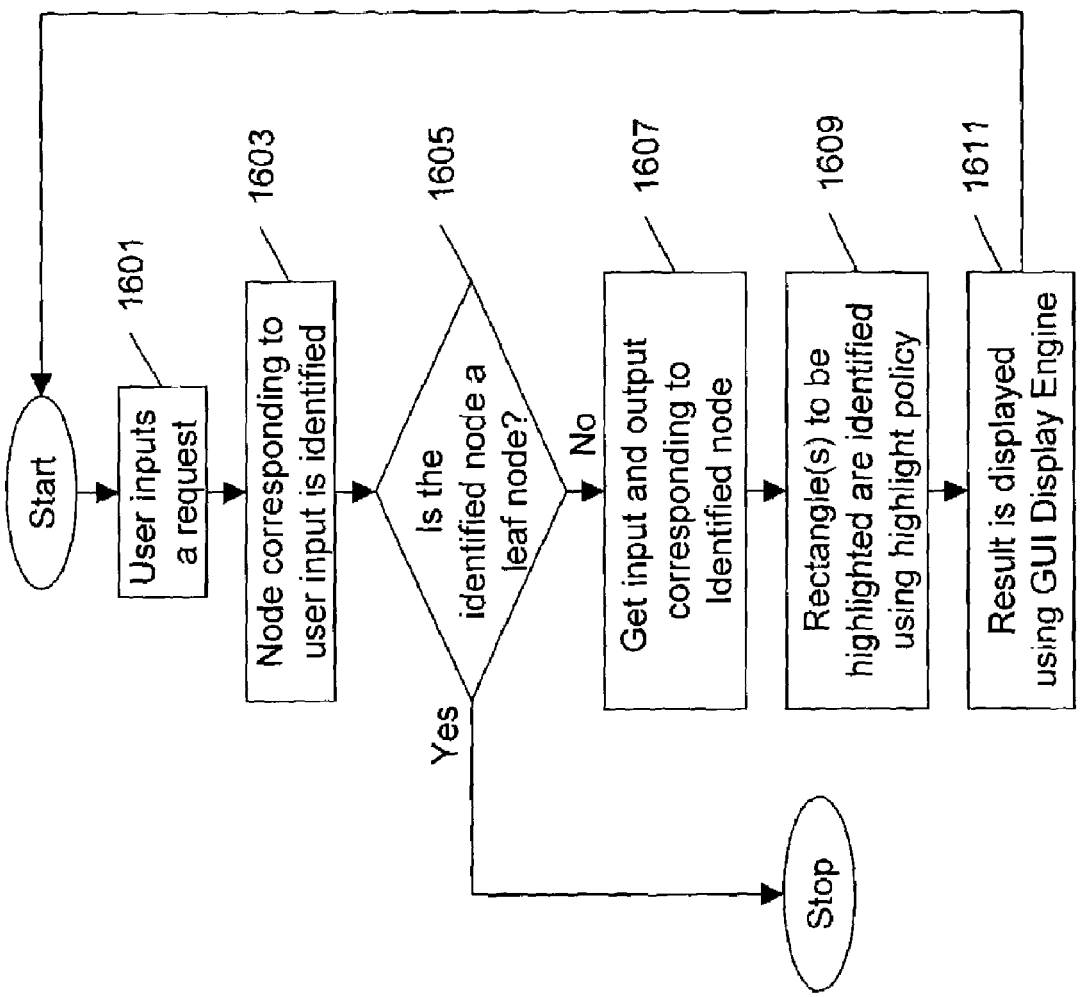
FIG. 16 shows various steps followed by the Highlighting Analysis Engine for identifying and highlighting portions of RTL source code in response to users query.

Various steps subsequent to Highlighting Analysis Engine 108 (as mentioned using above two examples) are summarized in flowchart of FIG. 16. At step 1601, the user sends a request to Highlighting Analysis Engine 108 by clicking on a displayed signal. The query sent through the request is—'provide the reason for the particular value of the chosen signal.' At step 1603, the node corresponding to the user query is identified in the gate level netlist corresponding to the RTL source code. At step 1605, Highlighting Analysis Engine 108 checks if the identified node corresponds to a leaf node. If the identified node is a leaf node, Highlighting Analysis Engine 108 cannot traverse backwards and thus Highlighting Analysis Engine 108 highlights the node and stops processing the request. If the identified node is not a leaf node, Highlighting Analysis Engine 108 performs step 1607. At step 1607, the input and output values corresponding to the identified node are obtained. Highlighting Analysis Engine 108 makes use of Simulation Value Database 112 to obtain input and output values. At step 1609, rectangles to be highlighted are identified using the highlight policy discussed earlier. To execute this step, Highlighting Analysis Engine 108 inputs following information to highlight policy:

a) Node name and type. For example 'AND', 'OR', 'MUX', etc.

b) Output port c) Input ports d) Output and input port simulations values.

Using these inputs, the highlight policy identifies the expression(s) or sub-expression(s) of the RTL source code to be highlighted in a manner as described previously using examples shown in FIG. 9–FIG. 15. At step 1611, the results are displayed to the user on GUI Display 114 using GUI Display Engine 116. The user may again send a request to Highlighting Analysis Engine 108 by clicking on the highlighted portion. Thus, steps 1601–1611 are repeated to send and process such a request.

Figure 17:
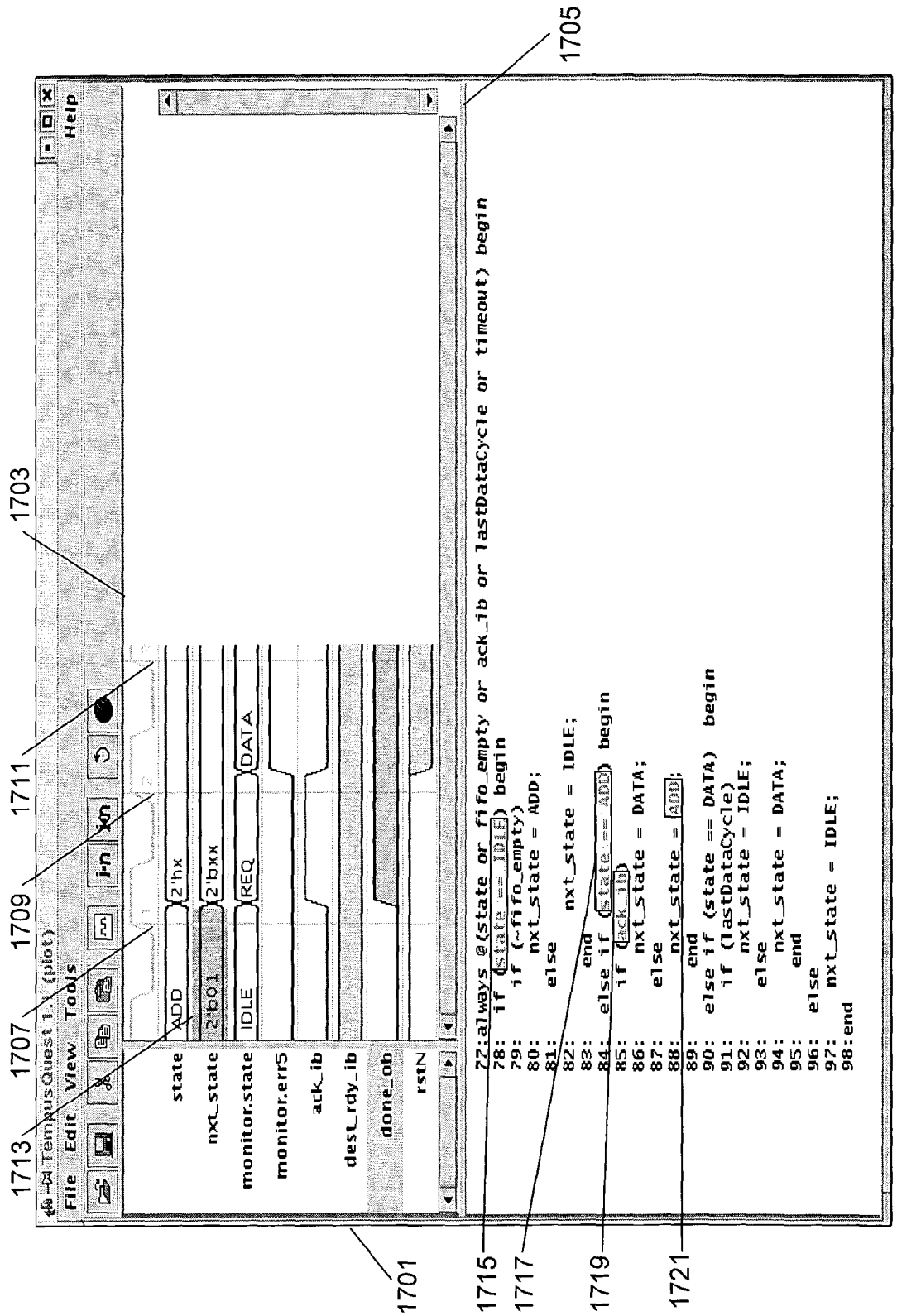
FIG. 17 shows a screenshot of the GUI Display.

For highlighting, GUI Display Engine 114 obtains information regarding the character number(s) and line number(s) to be highlighted using a rectangle. This information is provided to GUI Display Engine 114 by Highlighting Analysis Engine 108. GUI Display Engine 114 displays on GUI Display 116 and highlights the portions as specified by Highlighting Analysis Engine 108 using rectangles. A screenshot of GUI Display 116 is shown in FIG. 17. A Signal Window 1701 lists out the selected signals defined in RTL source code 102. Signals mentioned in Signal Window 1701 are 'state', 'nxt_state', 'monitor.state', 'monitor.err5', 'ack_ib', 'dest_rdy_ib', 'done$_{13}$ ob' and 'rstN'. Waveforms corresponding to the signals mentioned in Signal Window 1701 are displayed in Plot Window 1703. Lines 1707, 1709 and 1711 represent different time instances such that Line 1711 leads Line 1709 by one clock cycle and Line 1709 leads Line 1707 by one clock cycle. 'Why' Window 1705 displays portions of RTL Source Code 102 and highlights portions that correspond to user's query using rectangles. For example, in 'Why' Window 1705, rectangles 1715, 1717, 1719 and 1721 highlight portions of RTL source code.

The highlighted portions of the RTL source code illustrate the intended effect of selecting the leftmost displayed value of the signal nxt_state and then asking why it has this particular value. The highlighted portions indicate the particular assignment, shown using rectangle 1717, which results in the current value and the conditional part of conditional statements 1715, 1717 and 1719 that are relevant to this assignment.

To further illustrate, if the user clicks on rectangle 1715 in FIG. 17 (corresponding to the expression 'state==IDLE') and asks System 100 why the expression has the particular value ('0' in this case), System 100 would highlight exactly two rectangles corresponding to the leaves of the conditional expression 1715 (one corresponding to 'state' inside rectangle 1715 and another corresponding to 'IDLE' inside rectangle 1715).

Figure 18:
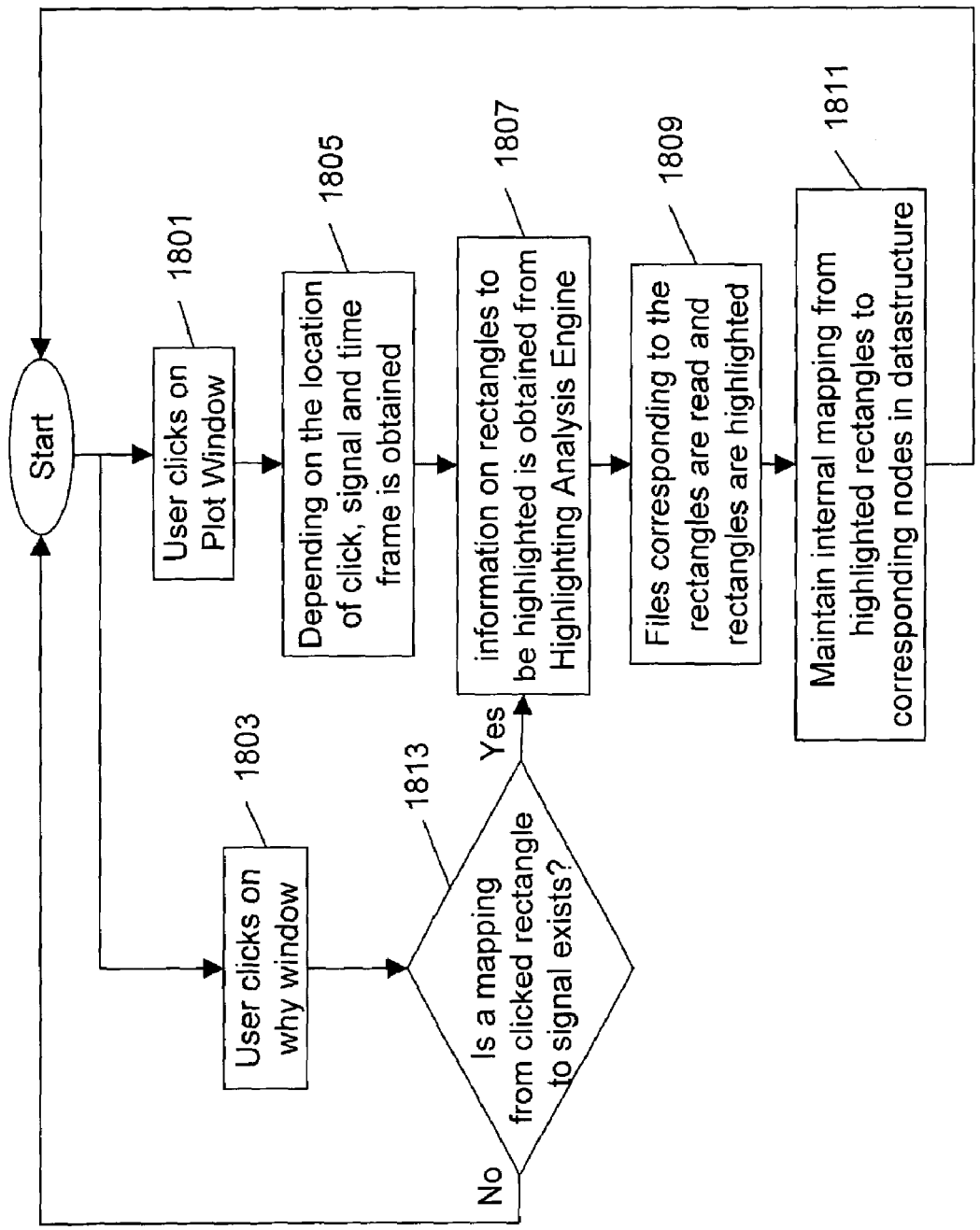
FIG. 18 displays a flowchart depicting the flow of various steps while presenting signal waveforms and corresponding portions of RTL source code.

The flow of various steps while displaying signal waveforms and the corresponding portions of RTL Source Code 102 is summarized using a flowchart shown in FIG. 18. To initiate the process, the user sends a request to Highlighting Analysis Engine 108. The user may send a request by clicking on a waveform displayed in Plot Window 1703 (at step 1801) or RTL source code displayed in 'Why' Window 1705 (at step 1803). In case the user inputs a request at step 1801, System 100 moves on to step 1805. At step 1805, signal and time frame corresponding to the user's input is obtained depending on the location of click in Plot Window 1703. This information is fed to Highlighting Analysis Engine 108. At step 1807, Highlighting Analysis Engine 108 provides information on the rectangle(s) to be highlighted to GUI Display Engine 114. On obtaining information on the rectangle(s) to be highlighted, at step 1809, GUI Display Engine 114 reads files corresponding to the rectangles. The rectangles are displayed and highlighted on GUI Display 116. At step 1811, internal mapping from the highlighted rectangle(s) to node(s) in the data-structure is maintained. After executing step 1811, System 100 moves to the initial state and waits for user's request. In case the user chooses to input request by clicking on a rectangle in 'Why' Window 1705 at step 1803, System 100 moves to step 1813. At step 1813, System 100 checks if there exists a mapping from clicked rectangle to a signal. If yes, System 100 moves to step 1807 and thereafter follows steps 1809 and 1811. If no, System 100 moves to initial state and waits for a request from the user.

The procedure followed by Highlighting Analysis Engine 108 (as shown in flowchart of FIG. 16), to determine the portion of RTL source code to be highlighted, is implemented using Java. However, it should be obvious to someone skilled in the art that the procedure can also be implemented using other standard programming languages. Connectivity between different system elements (as shown in FIG. 1) is provided through local, wide or Internet network infrastructure. Browsing or other data access operations are provided through a browser or functionally equivalent software. In networked configuration, design browser tools are designed such that the HDL based designs can be accessed remotely by various users. Further, network browsers such as Netscape Navigator or Microsoft Internet Explorer can be configured and used such that a browsing workstation is different from the workstation used for maintaining the HDL design database.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A method for displaying relevant portions of Register Transfer Language source code corresponding to displayed waveforms of signals, the method comprising steps of:
   a. displaying a plurality of waveforms of signals in a graphical user interface window;
   b. inputting a user's request of a user to display portions of Register Transfer Language source code that correspond to a value of a signal or a transition in a value of a signal at a particular time;
   c. identifying the portions of the Register Transfer Language source code corresponding to the user's request having steps of:
      i. synthesizing a gate level netlist from the Register Transfer Language source code;
      ii. performing instrumentation on the Register Transfer Language source code;
      iii. mapping the Register Transfer Language source code to the gate level netlist; and
      iv identifying the portions of the Register Transfer Language source code corresponding to the user's request using mapping including steps of:
         a. identifying a node of the gate level netlist corresponding to the signal that relates to the user's request,;
         b. traversing the gate level netlist backwards from the identified node to identify at least one node that corresponds to the value of the signal or the transition in the value of the signal at the particular time selected by the user, and
         c. identifying the portions of the register transfer language source code corresponding to the identified at least one node that corresponds to the value of the signal and the transition in the value of the signal at the particular time selected by the user using mapping; and
   d. displaying the identified portions of the Register Transfer Language source code.

2. A method for displaying relevant portions of Register Transfer Language source code corresponding to displayed waveforms of signals, the method comprising steps of:
   a. displaying a plurality of waveforms of signals in a graphical user interface window;
   b. inputting a user's request of a user to display portions of Register Transfer Language source code that correspond to a value of a signal or a transition in a value of a signal at a particular time;
   c. identifying the portions of the Register Transfer Language source code corresponding to the user's request; and
   d. displaying the identified portions of the Register Transfer Language source code having a step of displaying the identified portions of the Register Transfer Language in the window that displays the plurality of waveforms of signals.

3. A method for displaying relevant portions of Register Transfer Language source code corresponding to displayed waveforms of signals, the method comprising steps of:
   a. synthesizing a gate level netlist from the Register Transfer Language source code;
   b. mapping the Register Transfer Language source code to the gate level netlist;
   c. displaying the waveforms of signals defined in the Register Transfer Language source code;
   d. inputting a user's request of a user to display portions of the Register Transfer Language source code that correspond to a value of a signal or a transition in a value of a signal at a particular time;
   e. identifying the portions of the Register Transfer Language source code corresponding to the user's request having steps of:
      i. identifying a node of the gate level netlist corresponding to a waveform user selects;
      ii. traversing the gate level netlist backwards from the identified node to identify at least one node that corresponds to the value of the signal or the transition in the value of the signal at the particular time selected by the user; and
      iii. identifying the portions of the Register Transfer Logic source code corresponding to the identified at least one node that corresponds to the value of the signal and the transition in the value of the signal at the particular time selected by the user using mapping; and f. displaying the identified portions of the Register Transfer Language source code.

4. A method for displaying relevant portions of Register Transfer Language source code corresponding to displayed waveforms of signals, the method comprising steps of:
  a. synthesizing a gate level netlist from the Register Transfer Language source code;
  b. mapping the Register Transfer Language source code to the gate level netlist;
  c. displaying the waveforms of signals defined in the Register Transfer Language source code;
  d. inputting a user's request to display portions of the Register Transfer Language source code that correspond to a value of a signal or a transition in a value of a signal at a particular time;
  e. identifying the portions of the Register Transfer Language source code corresponding to the user's request; and
  f. displaying the identified portions of the Register Transfer Language source code having a step of displaying the identified portions of the Register Transfer Language in a window that displays a plurality of waveforms of signals.

5. A system for displaying relevant portions of Register Transfer Logic source code corresponding to displayed waveforms of signals, the system comprising:
  a. an Instrumentation Engine for instrumenting a plurality of nodes and subnodes of gate level netlist with line numbers and character numbers of Register Transfer Logic source code that correspond to the plurality of nodes and the plurality of subnodes;
  b. a Highlighting Analysis Engine for identifying lines and characters of the Register Transfer Logic source code that need to be displayed and highlighted;
  c. a database for storing the Register Transfer Logic source code and the instrumented gate level netlist;
  d. a Graphical User Interface Display Engine for converting lines and characters of the Register Transfer Logic source code to a format suitable for presentation, said Graphical User Interface Display Engine having:
    i. a Signal Window for listing out signals defined in the Register Transfer Language source code;
    ii. a Plot Window for displaying waveforms of the signals listed in the Signal Window; and
    iii. a Why Window for displaying and highlighting portions of the Register Transfer Logic source code corresponding to the user's request; and
  e. a Graphical User Interface for inputting the user's request, and displaying and highlighting lines and characters of the Register Transfer Logic source code corresponding to the user's request.

6. A computer program product for use with a computer, the computer program product comprising a computer usable medium having a computer readable program code embodied therein for displaying relevant portions of Register Transfer Language source code corresponding to displayed waveforms of signals, the computer readable program code performing steps of:
  a. displaying a plurality of waveforms of signals in a graphical user interface window;
  b. reading a user's request of a user to display portions of the Register Transfer Language source code that correspond to a value of a signal or a transition in a value of a signal at a particular time;
  c. identifying the portions of the Register Transfer Language source code corresponding to the user's request comprising steps of
    i. synthesizing a gate level netlist from the Register Transfer Language source code;
    ii. performing instrumentation on the Register Transfer Language source code;
    iii. mapping the Register Transfer Language source code to the gate level netlist; and
    iv. identifying the portions of the Register Transfer Language source code corresponding to the user's request using mapping including steps of:
      a. identifying a node of the gate level netlist corresponding to the signal that relates to the user's request;
      b. traversing the gate level netlist backwards from the identified node to identify at least one node that corresponds to the value of the signal or the transition in the value of the signal at the particular time selected by the user; and
      c. identifying the portions of the Register Transfer Language source code corresponding to the identified at least one node that corresponds to the value of the signal and the transition in the value of the signal at the particular time selected by the user using mapping; and
  d. displaying the identified portions of the Register Transfer Language source code.

7. A computer program product for use with a computer, the computer program product comprising a computer usable medium having a computer readable program code embodied therein for displaying relevant portions of Register Transfer Language source code corresponding to displayed waveforms of signals, the computer readable program code performing steps of:
  a. displaying a plurality of waveforms of signals in a graphical user interface window;
  b. reading a user's request to display portions of Register Transfer Language source code that correspond to a value of a signal or a transition in a value of a signal at a particular time;
  c. identifying the portions of the Register Transfer Language source code corresponding to the user's request; and
  d. displaying the identified portions of the Register Transfer Language source code comprising the computer readable program code displaying the identified portions of the Register Transfer Language in a window separate from the window that displays a plurality of waveforms of signals.

8. A computer based method for identifying relevant signals in a circuit model in a verification environment comprising steps of:
  receiving a trace corresponding to the circuit model;
  receiving a selected signal at a selected time step in said trace; and
  identifying a set of relevant signals, each signal with one or more associated time steps, including one or more signals that are fan-in signals of the selected signal, wherein a value of each said identified set of relevant signals at each associated time step relevantly determines said selected signal at said selected time step.

9. The method of claim 8, further comprising a step of: highlighting said identified set of relevant signals.

10. The method of claim 8, further comprising a step of: displaying said identified set of relevant signals.

11. The method of claim 10, where said displaying step includes displaying the identified set of relevant signals in a window separate from a window that displays at least a subset of said trace.

12. The method of claim 8, wherein said identifying step includes steps of:

identifying a first node of a gate level netlist corresponding to said selected signal;

traversing said gate level netlist backwards from said first node to identify at least one node that corresponds to a value of the selected signal or a transition in a value of the selected signal at said selected time step; and identifying portions of RTL source code corresponding to the identified at least one node that corresponds to the value of the selected signal and the transition in the value of the selected signal at the selected time step.

13. The method of claim 8, wherein said trace is an output of a formal verification process.

14. The method of claim 8, wherein said set of relevant signals can be at a first time step or a second time step wherein said selected signal is at said first time step.

* * * * *